US012062656B2

(12) United States Patent
Chiu

(10) Patent No.: US 12,062,656 B2
(45) Date of Patent: Aug. 13, 2024

(54) SEMICONDUCTOR DEVICE STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 378 days.

(21) Appl. No.: 17/514,507

(22) Filed: Oct. 29, 2021

(65) Prior Publication Data
US 2023/0138963 A1  May 4, 2023

(51) Int. Cl.
| H01L 21/00 | (2006.01) |
| H01L 21/761 | (2006.01) |
| H01L 23/528 | (2006.01) |
| H01L 27/088 | (2006.01) |
| H01L 23/00 | (2006.01) |

(52) U.S. Cl.
CPC .......... H01L 27/088 (2013.01); H01L 21/761 (2013.01); H01L 23/528 (2013.01); *H01L 24/16* (2013.01); *H01L 2224/16225* (2013.01)

(58) Field of Classification Search
CPC .... H01L 27/088; H01L 21/761; H01L 23/528
See application file for complete search history.

(56) References Cited

U.S. PATENT DOCUMENTS

| 5,854,500 | A * | 12/1998 | Krautschneider ... H01L 27/0629 257/330 |
| 6,218,232 | B1 * | 4/2001 | Heo ..................... H10B 12/482 239/254 |
| 7,518,169 | B2 * | 4/2009 | Taddiken .......... H01L 29/78639 257/288 |
| 9,412,736 | B2 * | 8/2016 | Ding ..................... H01L 23/481 |
| 9,997,443 | B2 * | 6/2018 | Brech ................. H01L 29/0804 |
| 2005/0253175 | A1 * | 11/2005 | Taddiken .......... H01L 29/78624 257/E29.279 |
| 2007/0158748 | A1 * | 7/2007 | Chu ..................... H01L 29/8605 257/E29.326 |

(Continued)

FOREIGN PATENT DOCUMENTS

| CN | 116031282 A | * | 4/2023 | ........... H01L 21/761 |
| CN | 117594598 A | * | 2/2024 | ..... H01L 21/823475 |

(Continued)

*Primary Examiner* — Laura M Menz
(74) *Attorney, Agent, or Firm* — MUNCY, GEISSLER, OLDS & LOWE, P.C.

(57) ABSTRACT

A semiconductor device structure including a doped region under an isolation feature is provided. The semiconductor device structure includes a first substrate, a first well region, a first gate structure, a second gate structure, a first doped region, and a first conductive feature. The substrate has a first surface and a second surface opposite to the first surface. The first well region is in the first substrate. The first well region has a first conductive type. The first gate structure is disposed on the second surface. The second gate structure is disposed on the second surface. The first doped region includes a second conductive type different from the first conductive type. The first doped region is disposed between the first gate structure and the second gate structure. The first conductive feature extends between the first surface of the first substrate and the first doped region.

12 Claims, 20 Drawing Sheets

(56) References Cited

U.S. PATENT DOCUMENTS

| | | | | |
|---|---|---|---|---|
| 2015/0129978 A1* | 5/2015 | Moon | ................... | H01L 23/481 |
| | | | | 257/394 |
| 2018/0337128 A1* | 11/2018 | Wu | ................... | H01L 27/14634 |
| 2022/0328472 A1* | 10/2022 | Lin | ....................... | H01L 23/485 |
| 2023/0126134 A1* | 4/2023 | Chiu | ..................... | H01L 27/088 |
| | | | | 438/294 |
| 2023/0138963 A1* | 5/2023 | Chiu | ................ | H01L 21/76898 |
| | | | | 257/368 |
| 2023/0282645 A1* | 9/2023 | Wohlmuth | ............ | H01L 29/205 |
| | | | | 257/194 |
| 2023/0320064 A1* | 10/2023 | Chiu | ....................... | H01L 28/60 |
| 2023/0320081 A1* | 10/2023 | Chiu | ....................... | H10B 12/31 |
| 2023/0377949 A1* | 11/2023 | Syue | ....................... | H01L 24/80 |
| 2024/0055301 A1* | 2/2024 | Higa | ................... | H01L 29/0696 |
| 2024/0090208 A1* | 3/2024 | Li | ........................ | H10B 20/20 |

FOREIGN PATENT DOCUMENTS

| | | | |
|---|---|---|---|
| DE | 102023121160 A1 * | 2/2024 | ..... H01L 21/823475 |
| TW | 200412667 A | 7/2004 | |
| TW | 200739903 A | 10/2007 | |
| TW | 201919218 A | 5/2019 | |
| TW | 202027262 A | 7/2020 | |
| TW | 202125636 A | 7/2021 | |

\* cited by examiner

SEMICONDUCTOR DEVICE STRUCTURE

TECHNICAL FIELD

The present disclosure relates to a semiconductor device structure, and more particularly, to a semiconductor device structure including a doped region under an isolation feature.

DISCUSSION OF THE BACKGROUND

Doped regions within a substrate can be used to electrically isolate adjacent transistors. An external supply voltage is required to electrically couple with the doped region such that a PN junction can be formed. However, the conductive traces used to transmit supply voltage need additional areas, which may adversely affect the performance of a semiconductor device structure.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a first substrate, a first well region, a first gate structure, a second gate structure, a first doped region, and a first conductive feature. The substrate has a first surface and a second surface opposite to the first surface. The first well region is in the first substrate. The first well region has a first conductive type. The first gate structure is disposed on the second surface. The second gate structure is disposed on the second surface. The first doped region includes a second conductive type different from the first conductive type. The first doped region is disposed between the first gate structure and the second gate structure. The first conductive feature extends between the first surface of the first substrate and the first doped region.

Another aspect of the present disclosure provides a semiconductor device structure. The semiconductor device structure includes a substrate, a first well region, a first transistor, a second transistor, a first doped region, and a circuit structure. The substrate has an active surface and a backside surface. The first well region is in the substrate. The first well region has a first conductive type. The first transistor is adjacent to the active surface of the substrate. The second transistor is adjacent to the active surface of the substrate. The first doped region includes a second conductive type different from the first conductive type. The first doped region is disposed in the first well region and between the first transistor and the second transistor. The circuit structure is on the backside surface of the substrate. The circuit structure is configured to transmit or provide a voltage electrically coupled with the first doped region.

Another aspect of the present disclosure provides a method for manufacturing a semiconductor device structure. The method includes: providing a substrate having a first surface and a second surface opposite to the first surface, wherein the substrate includes a first well region with a first conductive type; forming an isolation feature extending from the second surface of the substrate; forming a first transistor and a second transistor adjacent to the second surface of the substrate; forming a first doped region under the isolation feature, wherein the first doped region has a second conductive type different from the first conductive type; and providing a circuit structure on the first surface of the substrate, wherein the circuit structure is configured to transmit or provide a voltage electrically coupled with the first doped region.

Another aspect of the present disclosure provides a method for manufacturing a semiconductor device structure. The method includes: providing a substrate having a first surface and a second surface opposite to the first surface, wherein the substrate comprises a first well region with a first conductive type; forming a first transistor and a second transistor adjacent to the second surface of the substrate; forming a first doped region between the first transistor and the second transistor, wherein the first doped region has a second conductive type different from the first conductive type; and forming a first conductive feature extending between the first surface of the substrate and the first doped region.

The embodiments of the present disclosure disclose a semiconductor device structure with a doped region in a substrate. The aforesaid doped region has a conductive structure opposite to that of a well region of the substrate. The doped region is configured to generate a PN junction so as to electrically isolate adjacent transistors. Further, the semiconductor device structure includes a conductive structure extending from the backside surface of the substrate to electrically couple with the doped region. A power, such as a direct current bias, is provided from the backside surface to couple with the doped region through the conductive structure, generating a PN junction between the doped region and the well region of the substrate. In a comparative example, the conductive traces, being configured to couple with the doped region, are disposed on the active surface of the substrate. These conductive traces need additional areas and thus reduce the size of the active regions of the transistors. In comparison with the comparative example, the embodiments of the present disclosure can increase the size of the active regions of the transistors, and thus the performance of the semiconductor device structure is improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
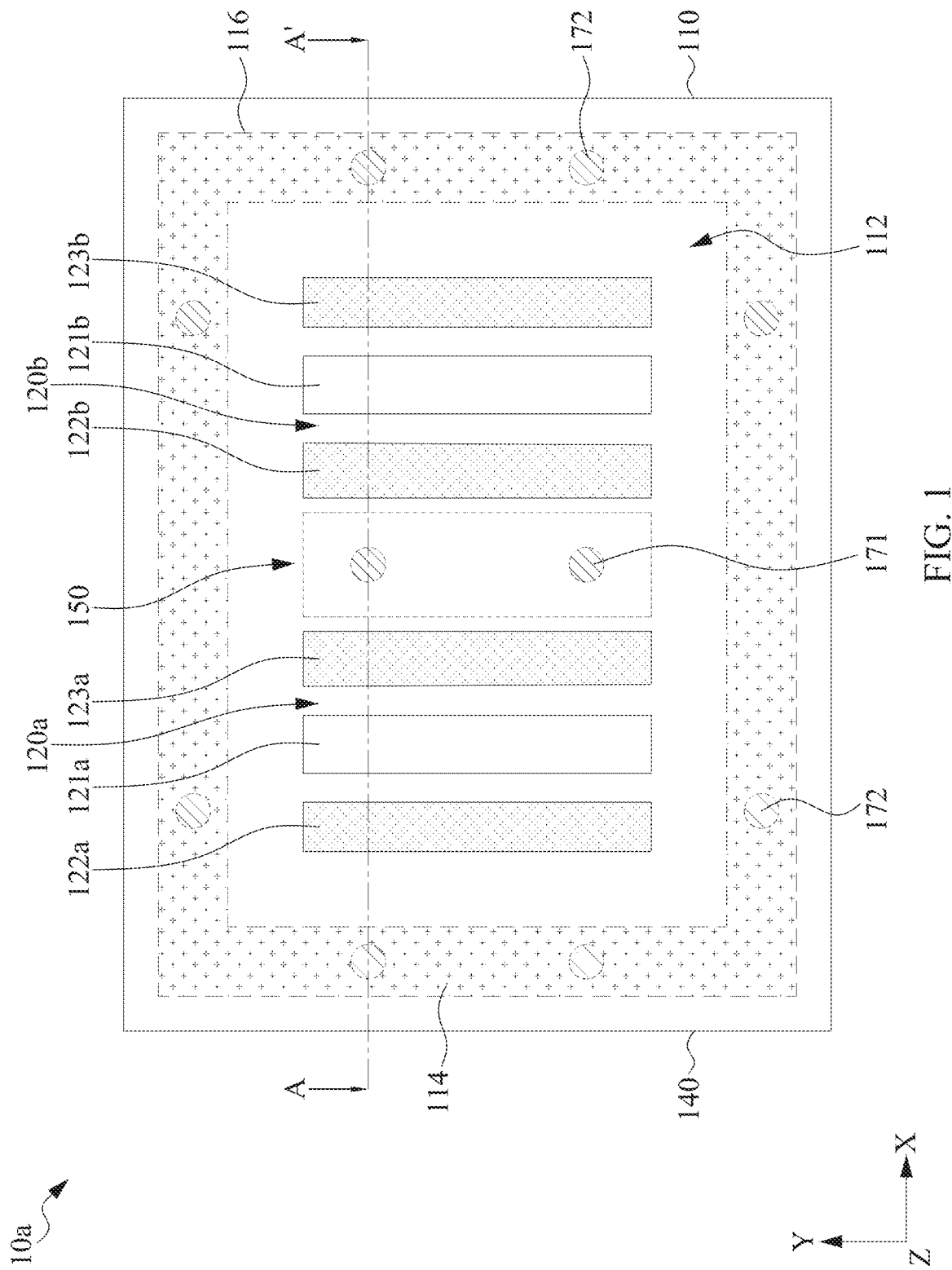
FIG. 1 is a top view of a layout of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2A:
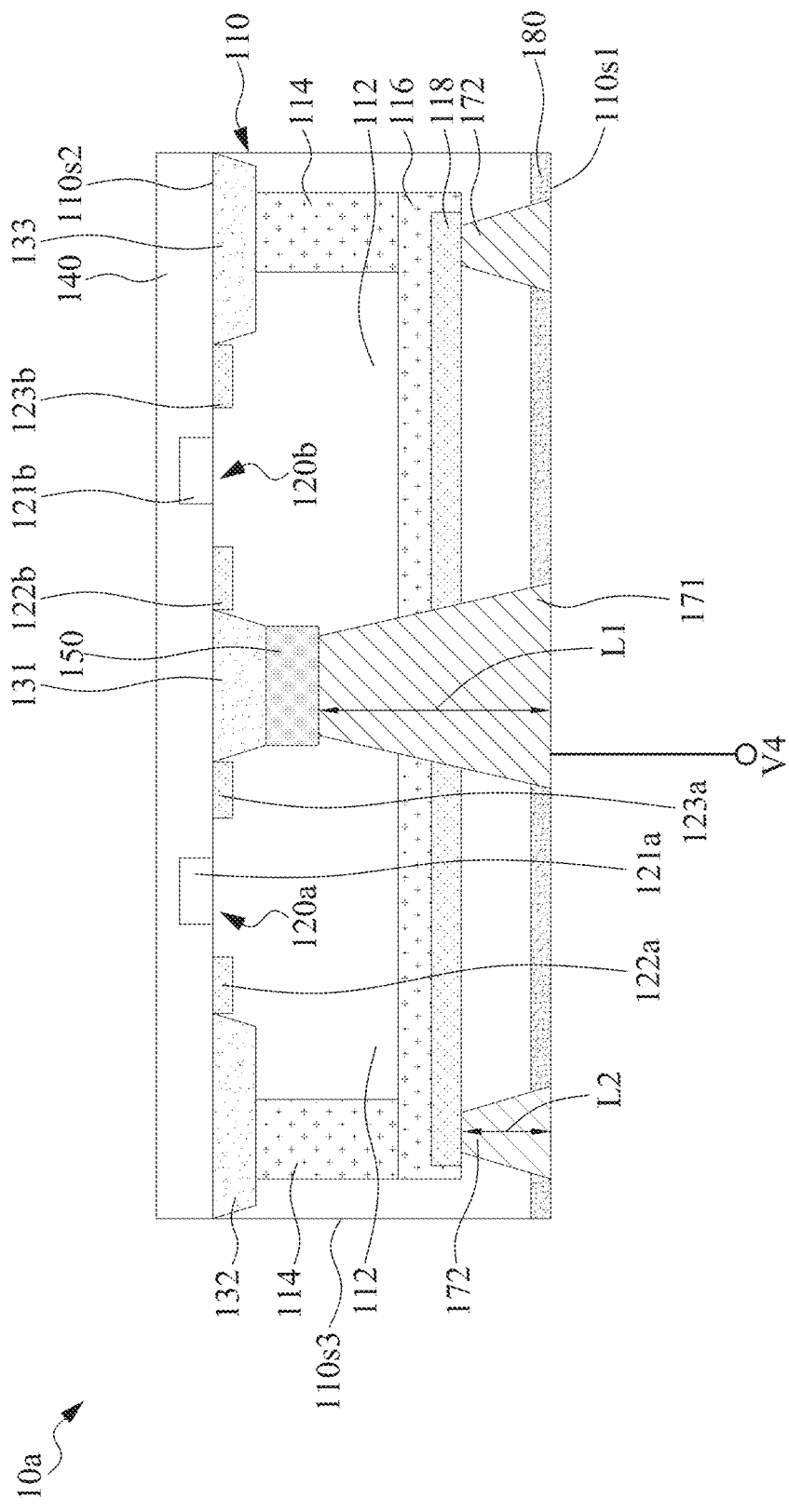
FIG. 2A is a cross-sectional view of a semiconductor device structure, along the dotted-line A-A' shown in FIG. 1, in accordance with some embodiments of the present disclosure.

Please refer to FIG. 1 and FIG. 2A: FIG. 1 is a top view of a layout of a semiconductor device structure 10a, and FIG. 2A is a cross-sectional view of the semiconductor device structure 10a along the dotted-line A-A' shown in FIG. 1.

In some embodiments, the semiconductor device structure 10a can include a substrate 110, transistors 120a and 120b, isolation features 131, 132 and 133, a dielectric layer 140, a doped region 150, conductive features 171 and 172 as well as a dielectric layer 180.

The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayer structure, or the substrate 110 may include a multilayer compound semiconductor structure. The substrate 110 may have a surface $110s1$ (or a lower surface), a surface $110s2$ (or an upper surface), and a surface $110s3$ (or a lateral surface). The surface $110s2$ is opposite to the surface $110s1$. The surface $110s3$ may extend between the surfaces $110s1$ and $110s2$. In this disclosure, the surface $110s1$ can also be referred to as a backside surface. In this disclosure, the surface $110s2$ can also be referred to as an active surface.

The semiconductor device structure 10a can include a well region 112. The well region 112 may be located within the substrate 110. In some embodiments, the well region 112 includes a first conductive type. In some embodiments, the first conductive type is a p-type. In some embodiments, p-type dopants include boron (B), other group III elements, or any combination thereof. In some embodiments, the first conductive type is an n-type. In some embodiments, n-type dopants include arsenic (As), phosphorus (P), other group V elements, or any combination thereof. The well region 112 can be referred to as a drift region.

The semiconductor device structure 10a can include a well region 114. The well region 114 can be located within the substrate 110 and surround a portion of the well region 112. As shown in FIG. 1, the well region 114 may have a rectangle profile in the XY plane. In some embodiments, the well region 114 may have a ring shape profile in the XY plane. The well region 114 can enclose the transistors 120a and 120b as well as the doped region 150. As shown in FIG. 2A, the well region 114 can be located under the isolation features 131 or 133. The well region 114 can extend from the bottom surface of the isolation features 131 or 133 along the Z direction. The well region 114 can be separated from the surface $110s2$ of the substrate 110. In some embodiments, the well region 114 includes a second conductive type different from the first conductive type. In some embodiments, the well region 114 can be configured to be electrically coupled with the conductive feature 172 such that a PN junction can be formed between the well region 112 and the well region 114.

The semiconductor device structure 10a can include a well region 116. The well region 116 can be located within the substrate 110. The well region 116 can be in contact with the well region 114. More specifically, the well region 116 can be in contact with the bottom of the well region 114 such that the well regions 114 and 116 can collaboratively surround the well region 112 in the XZ plane. In some embodiments, the well region 116 can be a continuous doped region in the XY plane. The well region 116 can be separated from the surface 110s1 of the substrate 110. The well region 116 can be separated from the surface 110s2 of the substrate 110. In some embodiments, the well region 116 includes a second conductive type. In some embodiments, the well region 116 can be configured to be electrically coupled with the conductive feature 172 such that a PN junction can be formed between the well region 112 and the well region 116.

The semiconductor device structure 10a can include a doped region 118. The doped region 118 can be disposed within the well region 116. In some embodiments, the doped region 118 can be configured to electrically couple with the conductive feature 172. In some embodiments, the well region 116 can be a continuous doped region in the XY plane. In some embodiments, the doped region 118 includes the second conductive type. In some embodiments, the doped region 118 can have a dopant concentration greater than a dopant concentration of the well region 112, 114 or 116.

The transistors 120a and 120b are disposed on the surface 110s2 of the substrate 110. The transistor 120a is electrically isolated from the transistor 120b. The transistor 120a can include a gate structure 121a, doped regions 122a, and 123a. The transistor 120b can include a gate structure 121b, doped regions 122b, and 123b.

As shown in FIG. 1, each of the gate structures 121a and 121b can extend along the Y direction. As shown in FIG. 2, each of the gate structures 121a and 121 can be disposed on the surface 110s2 of the substrate 110. Each of the gate structures 121a and 121b can include a gate dielectric (not shown) and a gate electrode (not shown). The gate dielectric can have a single layer or a multi-layer structure. In some embodiments, the gate dielectric can include dielectric material such as silicon oxide, silicon nitride, silicon oxynitride, other dielectric materials, or a combination thereof. In some embodiments, the gate dielectric is a multi-layer structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

The gate electrode is disposed on the gate dielectric. The gate electrode can include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, the gate electrode includes a work function metal layer that provides a metal gate with an n-type-metal work function or p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials.

Each of the doped regions 122a, 123a, 122b and 123b is disposed in the substrate 110 and adjacent to the surface 110s2 of the substrate 110. As shown in FIG. 1, each of the doped regions 122a, 123a, 122b and 123b extends along the Y direction. The doped regions 122a and 123a are disposed on two opposite sides of the gate structure 121a. The doped regions 122b and 123b are disposed on two opposite sides of the gate structure 121b. Each of the doped regions 122a, 123a, 122b and 123b includes the second conductive type. Each pair of doped regions 122a and 123a as well as doped regions 122b and 123b can also be referred to as a source/drain feature.

Each of the isolation features 131, 132 and 133 can be disposed within the substrate 110 and extend from the surface 110s2 of the substrate 110. In some embodiments, each of the isolation features 131, 132 and 133 can be a shallow trench isolation (STI). The isolation feature 131 can be disposed between the isolation features 132 and 133. The isolation feature 131 can be disposed between the transistors 120a and 120b. In some embodiments, the isolation features 132 and 133 as well as the well regions 114 and 116 can define an enclosed region enclosing the doped region 150.

The dielectric layer 140 can be disposed on the surface 110s2 of the substrate 110. The dielectric layer 140 can include silicon oxide, carbon-containing oxide such as silicon oxycarbide (SiOC), silicate glass, tetraethylorthosilicate (TEOS) oxide, undoped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials.

The doped region 150 is disposed in the substrate 110. As shown in FIG. 1, the doped region 150 can extend along the Y direction. The doped region 150 can be aligned to the gate structure 121a and 121b. The doped region 150 can be disposed between the transistors 120a and 120b. As shown in FIG. 2A, in some embodiments, the doped region 150 is disposed under the isolation feature 131. The doped region 150 can be covered by the isolation feature 131 along the Z direction. In some embodiments, the doped region 150 can be configured to generate a PN junction between the well region 112 and the doped region 150 such that the transistor 120a can be electrically isolated from the transistor 120b. The doped region 150 can include the second conductive type. In some embodiments, the doped region 150 can have a dopant concentration greater than that of the well region 112 or 114. In some embodiments, the doped region 150 can be composed of a plurality of doped regions, and there may be no boundaries or obvious boundaries between these doped regions.

The conductive feature 171 can extend from the surface 110s1 of the substrate 110. The conductive feature 171 can be configured to couple with the doped region 150 such that a PN junction can be generated. In some embodiments, the conductive feature 171 can extend between the surface 110s1 of the substrate 110 and the doped region 150. In some embodiments, the conductive feature 171 can be in contact with the doped region 150. In some embodiments, the conductive feature 171 can be exposed from the surface 110s1 of the substrate 110. In some embodiments, the conductive feature 171 can penetrate a portion of the substrate 110. In some embodiments, the well region 116 is in contact with and electrically coupled with the conductive feature 171. In some embodiments, the well region 116 is in contact with and electrically coupled with the conductive feature 171. In some embodiments, the doped region 118 is in contact with and electrically coupled with the conductive feature 171. In some embodiments, the conductive feature 171 can include a liner layer (not shown), a barrier layer (not shown) and a conductive layer (not shown). The liner layer can include oxide or other suitable materials. The barrier layer can include titanium, tantalum, titanium nitride, tantalum nitride, manganese nitride or a combination thereof. The conductive layer may include metal, such as W, Cu, Ru, Ir, Ni, Os, Rh, Al, Mo, Co, alloys thereof, or combinations thereof. In some embodiments, the conductive feature 171 can be electrically connected to a supply voltage V4. In some embodiments, the supply voltage V4 is transmitted to the doped region 150 from the surface 110s1 of the substrate 110. For example, the supply voltage V4 can be transmitted by, but is not limited to, a circuit structure or a circuit board attached to the surface 110s1 of the substrate 110.

The conductive feature 172 can extend from the surface 110s1 of the substrate 110. The conductive feature 172 can be configured to be coupled with the doped region 118 such that a PN junction can be generated. In some embodiments, the conductive feature 172 can be in contact with the doped region 118. In some embodiments, the conductive feature 172 can be exposed from the surface 110s1 of the substrate 110. In some embodiments, the conductive feature 172 can penetrate a portion of the substrate 110. In some embodiments, the conductive feature 172 can extend between the surface 110s1 of the substrate 110 and the doped region 118. As shown in FIG. 2, the conductive feature 171 can have a length L1 along the Z direction. The conductive feature 172 can have a length L2 along the Z direction. In some embodiments, L1 is greater than L2. The conductive feature 172 can have materials similar to or the same as that of the conductive feature 171. In some embodiments, as shown in FIG. 1, the well region 114 can overlap the conductive feature 172 along the Z direction.

The semiconductor device structure 10a can further include a dielectric layer 180. The dielectric layer 180 can be disposed adjacent to the surface 110s1 of the substrate 110. The dielectric layer 180 can include dielectric materials, such as silicon oxide, silicon nitride or other suitable materials.

In a comparative example, the supply voltage of the doped region 150 is transmitted from the active surface of the substrate and penetrates the isolation feature. These conductive traces for transmitting the aforesaid supply voltage may require additional areas to accommodate them. In comparison with the comparative example, the supply voltage V4 is transmitted from the backside surface of the surface 110s1 of the substrate 110. As a result, the size of the isolation feature 131 can be reduced, and thus the active area of the semiconductor device structure 10a can be increased.

Figure 2B:
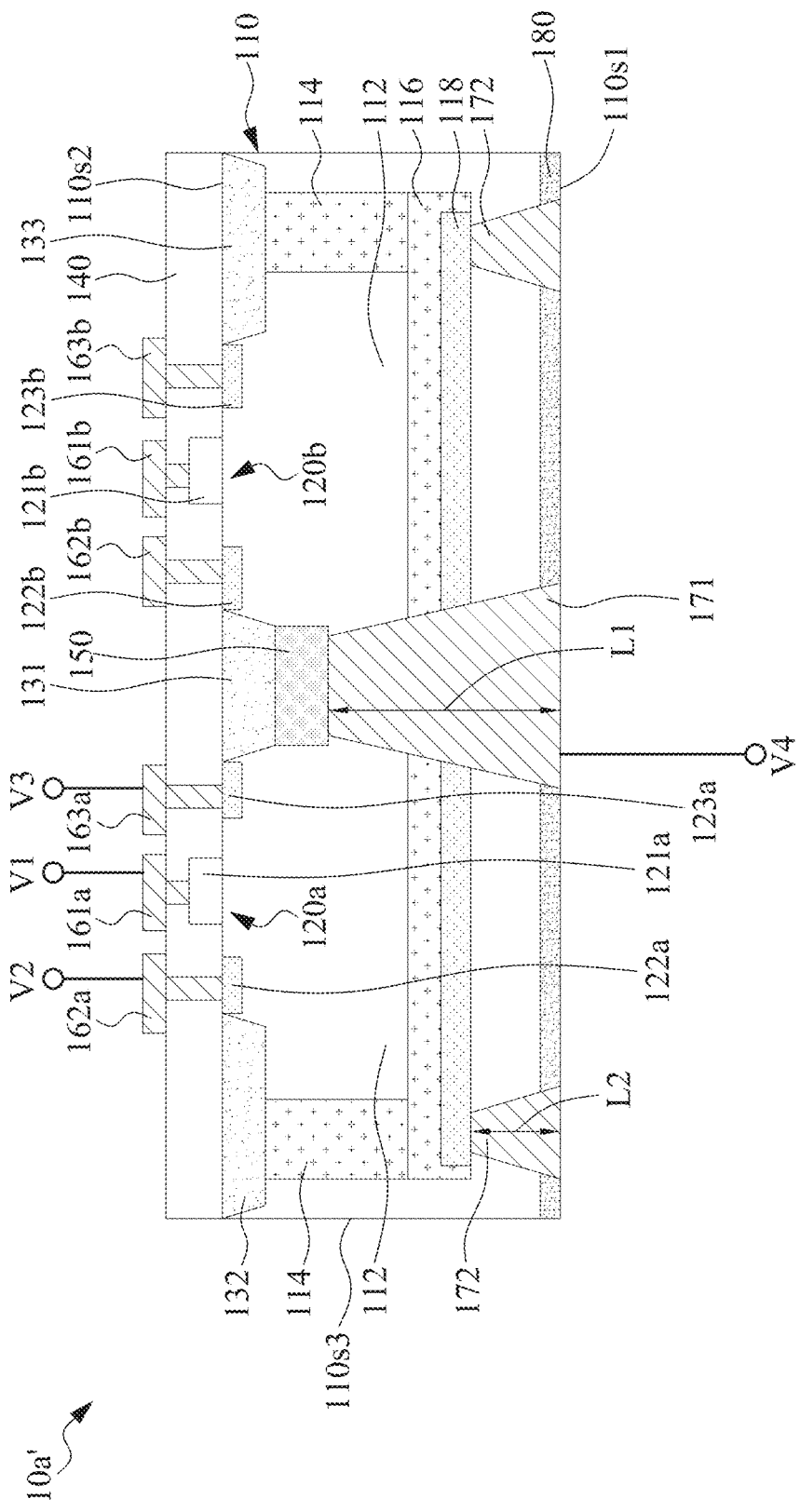
FIG. 2B is a cross-sectional view of a semiconductor device structure, in accordance with some embodiments of the present disclosure.

FIG. 2B is a cross-sectional view of a semiconductor device structure, in accordance with some embodiments of the present disclosure. FIG. 2B is a cross-sectional view of the semiconductor device structure 10a'. The semiconductor device structure 10a' of FIG. 2B is similar to the semiconductor device structure 10a of FIG. 2A, and one of the differences is that the semiconductor device structure 10a' further includes conductive structures 161a, 162a, 163a, 161b, 162b and 163b.

Each of the conductive structures 161a, 162a, 163a, 161b, 162b and 163b can penetrate the dielectric layer 140. Each of the conductive structures 161a, 162a, 163a, 161b, 162b and 163b can include conductive materials, e.g., metal, such as tungsten (W), copper (Cu), Ru, Ir, Ni, Os, Rh, Al, Mo, Co, alloys thereof, or combinations thereof. The conductive structure 161a can be electrically coupled to the gate structure 121a. The conductive structure 162a can be electrically coupled to the doped region 122a. The conductive structure 163a can be electrically coupled to the doped region 123a. The conductive structure 161b can be electrically coupled to the gate structure 121b. The conductive structure 162b can be electrically coupled to the doped region 122b. The conductive structure 163b can be electrically coupled to the doped region 123b. In this disclosure, each of the conductive structures 161a, 162a, 163a, 161b, 162b and 163b can be referred to as a "zero metal layer (M0)."

In some embodiments, the conductive structures 161a, 162a and 163a can be imposed on different supply voltages. For example, the conductive structure 161a can be electrically connected to a supply voltage V1, the conductive structure 162a can be electrically connected to a supply voltage V2, and the conductive structure 163a can be electrically connected to a supply voltage V3. In some embodiments, each of the supply voltages V1, V2 and V3 is electrically isolated from the doped region 150. In some embodiments, each of the supply voltages V1, V2 and V3 can be transmitted from the surface 110s2 of the substrate 110. For example, the conductive traces transmitting supply voltages V1, V2 and V3 can include the first metal layer (M1), which is disposed over the M0, and the second metal layer (M2), which is disposed over the M1, and so on. Similarly, the conductive structures 161b, 162b and 163b can be imposed on different supply voltages.

Figure 3:
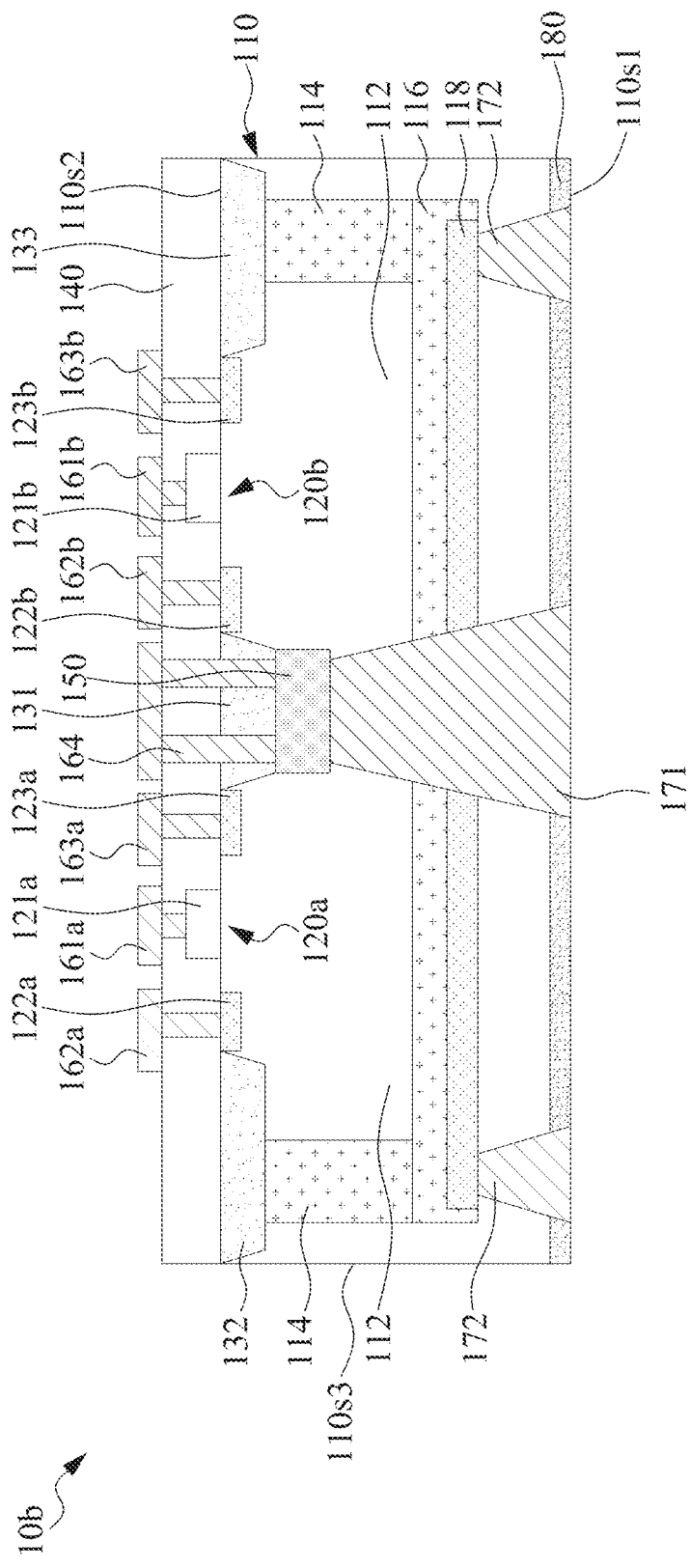
FIG. 3 is a cross-sectional view of a semiconductor device structure, in accordance with some embodiments of the present disclosure.

FIG. 3 is a cross-sectional view of a semiconductor device structure 10b, in accordance with some embodiments of the present disclosure. The semiconductor device structure 10b has a structure similar to that of the semiconductor device structure 10a', and one of the differences is that the semiconductor device structure 10b further includes a conductive structure 164.

The conductive structure 164 can be disposed on the surface 110s1 of the substrate 110. In some embodiments, the conductive structure 164 can penetrate the isolation feature 131. In some embodiments, the conductive structure 164 can be electrically coupled to the doped region 150. In some embodiments, the conductive structure 164 can be in contact with the doped region 150. In some embodiments, the conductive structure 164 can be electrically coupled to the conductive feature 171 (or the supply voltage V4 shown in FIG. 2B). The conductive structure 164 can be configured to transmit electrical signals, such as the supply voltage shown in FIG. 2B, to other elements (not shown). In this embodiment, not all of the supply voltages are electrically coupled to the transistors or other elements from the active surface of the substrate. As a result, the layout of the metal traces can be designed in a more flexible manner.

Figure 4:
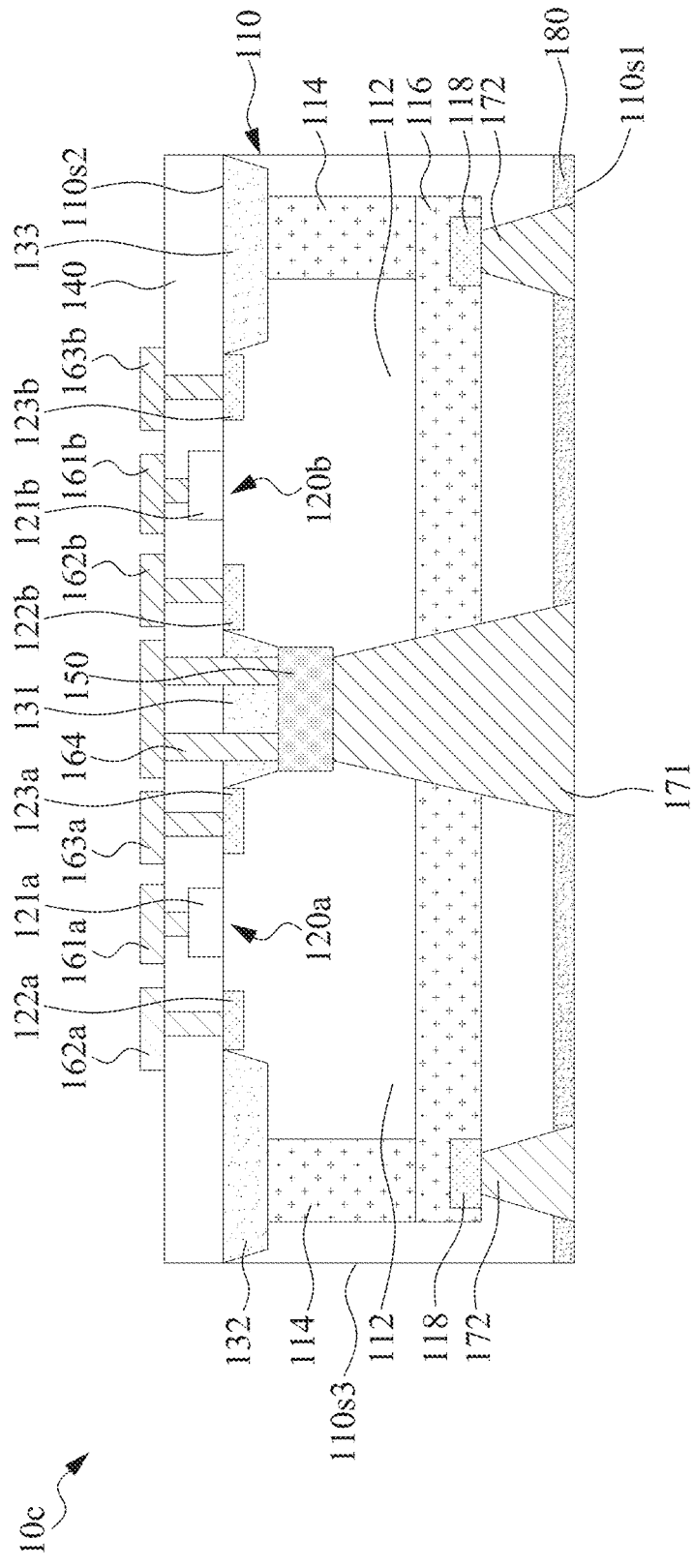
FIG. 4 is a cross-sectional view of a semiconductor device structure, in accordance with some embodiments of the present disclosure.

FIG. 4 is a cross-sectional view of a semiconductor device structure 10c, in accordance with some embodiments of the present disclosure. The semiconductor device structure 10c has a structure similar to that of the semiconductor device structure 10b, except for the doped region 118.

In some embodiments, the doped region 118 can be spaced apart from the conductive feature 171. In some embodiments, the doped region 118 can have a ring shape profile which is the same as that of the well region 114. In some embodiments, the doped region 118 can have a plurality of sections separated from each other, and each of the plurality of sections can be in contact with one conductive feature 172 shown in the top view of FIG. 1.

Figure 5:
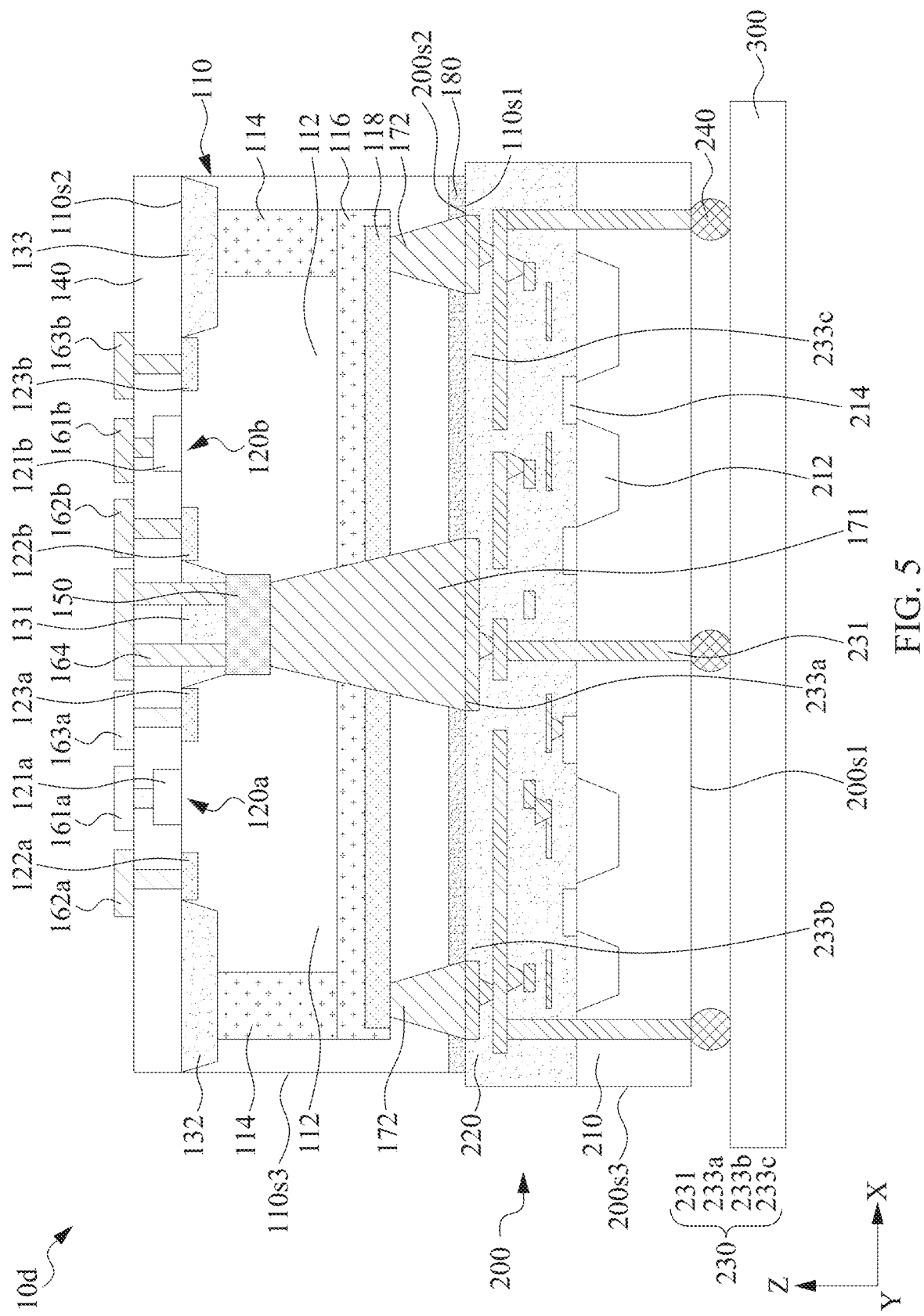
FIG. 5 is a cross-sectional view of a semiconductor device structure, in accordance with some embodiments of the present disclosure.

FIG. 5 is a cross-sectional view of a semiconductor device structure 10d, in accordance with some embodiments of the present disclosure.

The semiconductor device structure 10d has a structure similar to that of the semiconductor device structure 10b, and one of the differences is that the semiconductor device structure 10d further includes a circuit structure 200 and a circuit board 300.

In some embodiments, the circuit structure 200 can be bonded or attached to the surface 110s1 of the substrate 110. The circuit structure 200 can be configured to provide or transmit a voltage electrically coupled with the doped region 150. The circuit structure 200 can include a surface 200s1 (or a lower surface), a surface 200s2 (or an upper surface), and a surface 200s3 (or a lateral surface). The surface 200s2 is opposite to the surface 200s1. The surface 200s2 of the circuit structure faces the surface 100s1 of the substrate 100. The surface 200s3 extends between the surface 200s1 and the surface 200s2. In some embodiments, the surface 200s3 of the circuit structure 200 and the surface 110s3 of the substrate 110 are discontinuous. In some embodiments, the surface 200s3 of the circuit structure 200 is not coplanar with the surface 110s3 of the substrate 110. The circuit structure 200 can include a substrate 210, a dielectric structure 220, a conductive structure 230, and terminals 240.

The substrate 210 may be a semiconductor substrate, such as a bulk semiconductor, a semiconductor-on-insulator (SOI) substrate, or the like. The substrate 210 can include an elementary semiconductor including silicon or germanium in a single crystal form, a polycrystalline form, or an amorphous form.

The circuit structure 200 may include a plurality of isolation features 212. The isolation features 212 can be embedded in the substrate 210. The isolation features 212 can be a shallow trench isolation (STI).

The circuit structure 200 can further include a plurality of gate structures 214. The gate structures 214 can be disposed on the substrate 210. The gate structures 214 can be separated from each other by the isolation features 212. Each of the gate structures 214 can include a gate dielectric (not shown) and a gate electrode (not shown).

The dielectric structure 220 can be disposed on the substrate 210. The dielectric structure 220 can include a plurality of dielectric layers. The dielectric structure 220 can include oxide, nitride or other suitable materials. In some embodiments, the material of the dielectric structure 220 can be similar to or the same as that of the dielectric layer 180. For example, both the dielectric structure 220 and the dielectric layer 180 include silicon oxide.

The conductive structure 230 can be disposed within the substrate 210 and in the dielectric structure 220. The conductive structure 230 can be configured to electrically connect the circuit board 300 and the conductive feature 171. The conductive structure 230 can be electrically coupled with the circuit board 300. The conductive structure 230 can include conductive materials, such as W, Cu, Ru, Ir, Ni, Os, Rh, Al, Mo, Co, alloys thereof, or combinations thereof. The conductive structure 230 can include conductive vias 231, terminals 233a, 233b and 233c.

In some embodiments, the conductive via 231 can penetrate substrate 210. In some embodiments, the conductive via 231 can penetrate a portion of the dielectric structure 220. In some embodiments, the conductive via 231 can be exposed from the surface 200s1 of the circuit structure 200.

In some embodiments, the terminal 233a can be electrically coupled with the conductive feature 171. The terminal 233a can be in contact with the conductive feature 171. In some embodiments, each of the terminals 233b and 233c can be electrically coupled with the corresponding conductive feature 172. Each of the terminals 233b and 233c can be in contact with the corresponding conductive feature 172. In some embodiments, each of the terminals 233a, 233b and 233c can be exposed from the surface 200s2 of the circuit structure 200. In some embodiments, each of the terminals 233a, 233b and 233c can include a conductive pad or other elements.

In some embodiments, the substrate 110 can be hybrid bonded to the circuit structure 200. For example, the substrate 110 is bonded to the circuit structure 200 through binding the dielectric structure 220 of the circuit structure 200 to the dielectric layer 180 of the substrate 110, and through the terminals 233a, 233b, and 233c of the circuit structure 200 to the conductive features 171 and 172 of the substrate 110.

The terminals 240 can be disposed on the surface 200s1 of the circuit structure 200. The terminal 240 can electrically connect the conductive structure 230 of the circuit structure 200 and the circuit board 300. In some embodiments, the terminal 240 is a solder ball (e.g., Sn ball).

The circuit board 300 can be attached to the circuit structure 200 through the terminals 240. The circuit board 300 can be configured to inject power into the circuit structure 200. In some embodiments, the power can include, for example, a direct current (DC) bias. The circuit board can include, but is not limited to, a printed circuit board, a flexible printed circuit board or other circuit boards.

In this embodiment, the circuit board 300 can provide power to electrically couple to the doped region 150 from the surface 110s1 of the substrate 110. As a result, the transistor 120a can be electrically isolated from the transistor 120b. Further, the circuit board 300 can further provide power to electrically couple to other elements through the conductive structure 164.

FIG. 6A, FIG. 6B, FIG. 6C, FIG. 6D, FIG. 6E, FIG. 6F, FIG. 6G, FIG. 6H, FIG. 6I and FIG. 6J illustrate various stages of manufacturing a semiconductor device structure 10b, in accordance with some embodiments of the present disclosure.

Figure 6A:
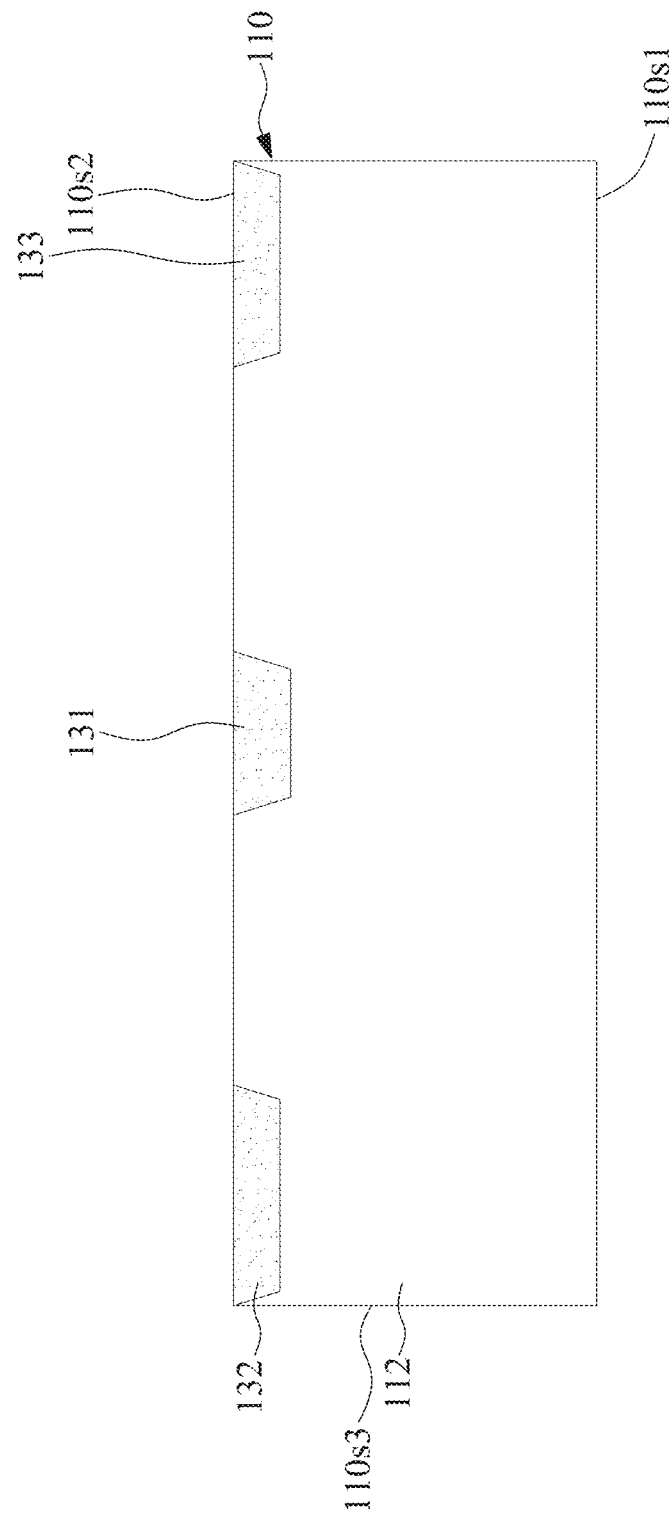
FIG. 6A, FIG. 6B, FIG. 6C, FIG. 6D, FIG. 6E, FIG. 6F, FIG. 6G, FIG. 6H, FIG. 6I and FIG. 6J illustrate various stages of manufacturing a semiconductor device structure, in accordance with some embodiments of the present disclosure.

Referring to FIG. 6A, a substrate 110 can be provided. The well region 112 can be formed in the substrate 110. The isolation features 131, 132 and 133 can be formed in the substrate 110, and adjacent to the surface 110s2 of the substrate 110.

Figure 6B:
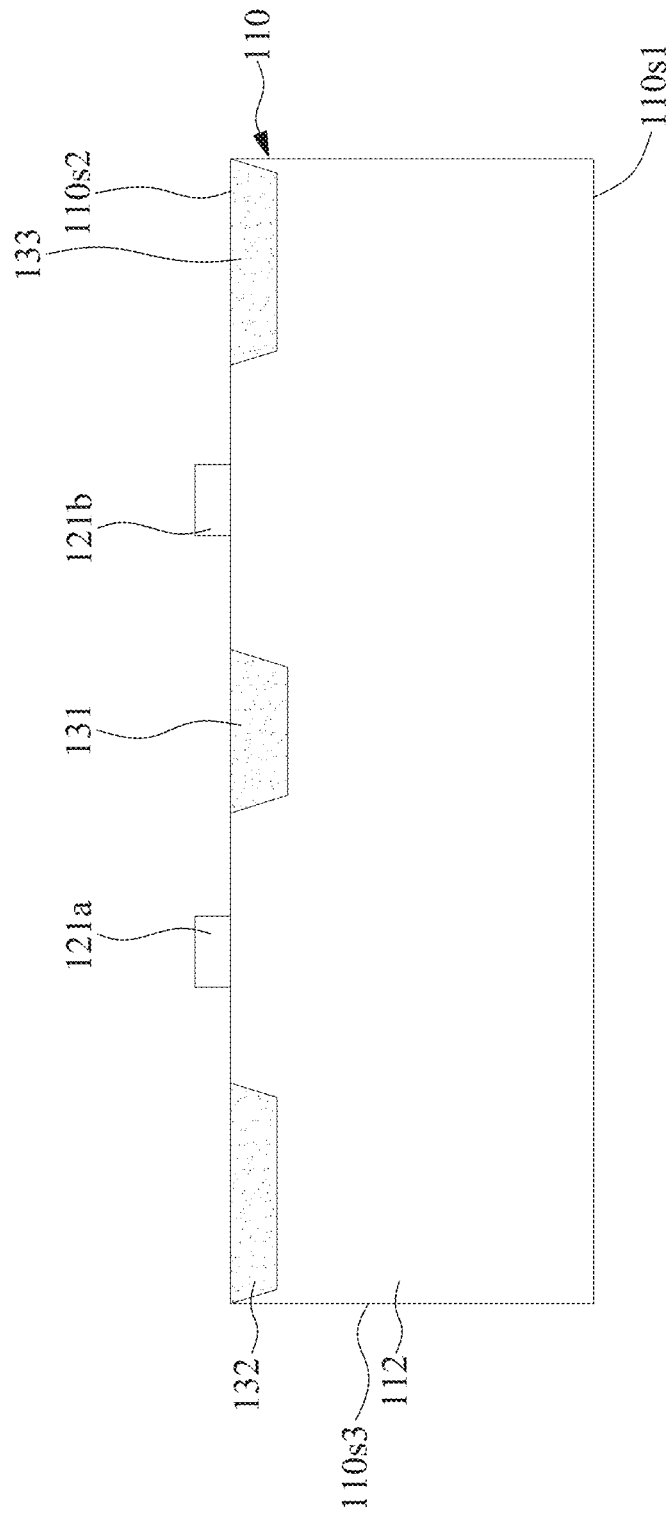

Referring to FIG. 6B, the gate structures 121a and 121b can be formed on the surface 110s2 of the substrate 110. The gate structures 121a and 121b can be formed on two opposite sides of the isolation feature 131.

Figure 6C:
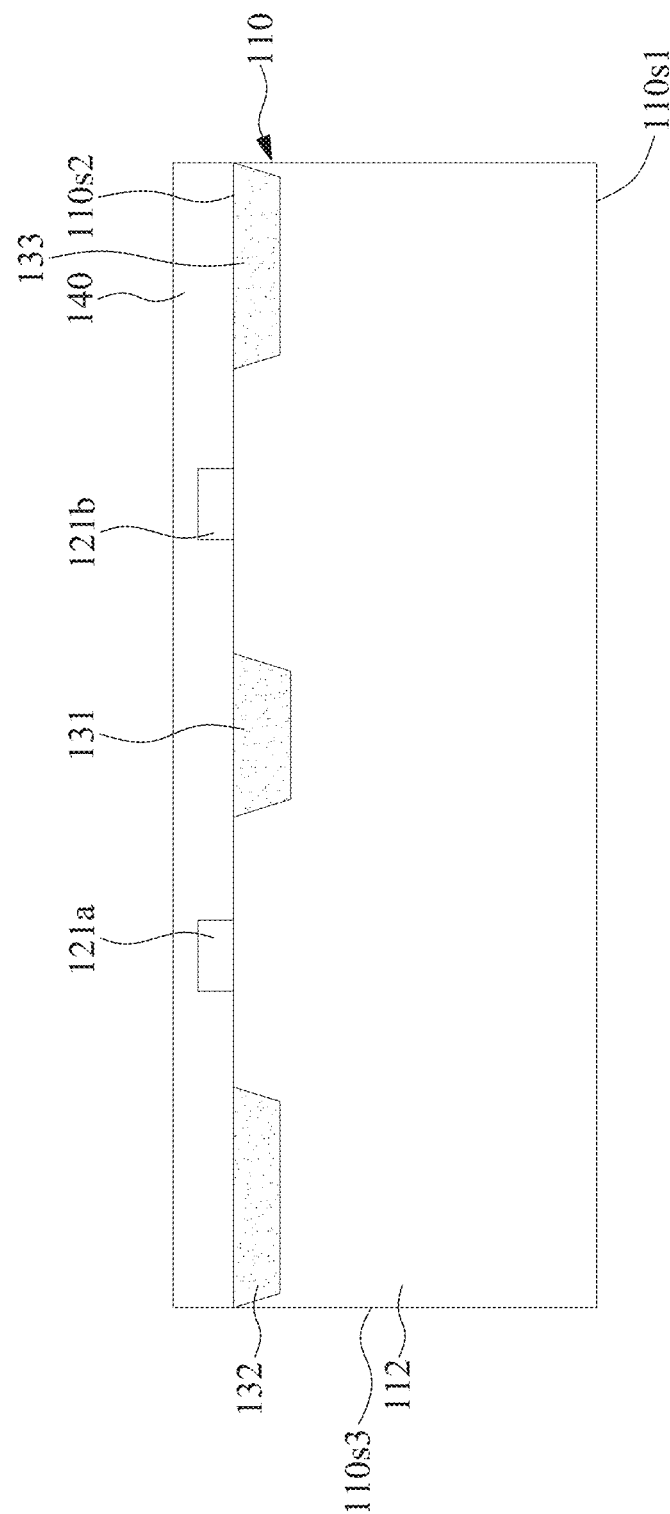

Referring to FIG. 6C, the dielectric layer 140 can be formed on the surface 110s2 of the substrate 110. The dielectric layer 140 can cover the surface 110s2 of the substrate 110. The dielectric layer 140 can cover the gate structures 121a and 121b. The dielectric layer 140 can be formed by chemical vapor deposition (CVD), plasma enhanced CVE (PECVD), flowable CVD (FCVD), spin coating or the like.

Figure 6D:
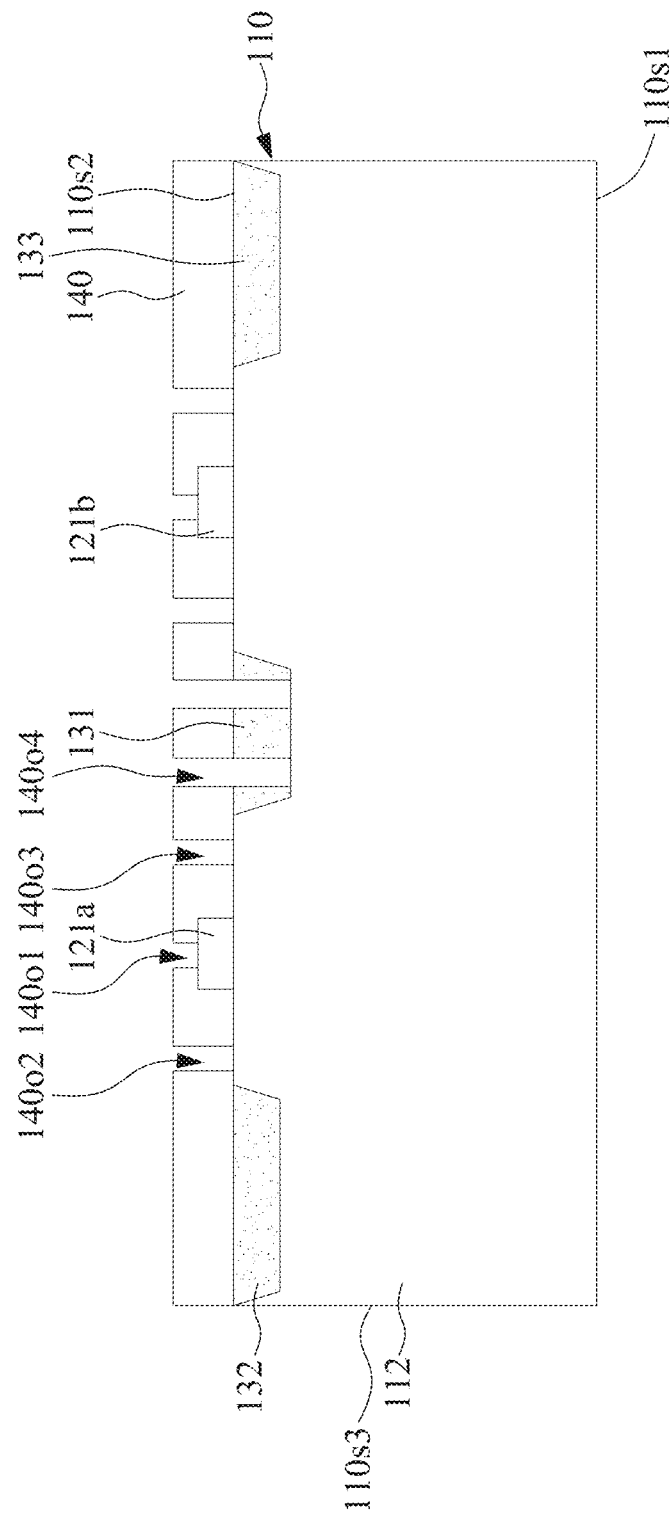

Referring to FIG. 6D, a plurality of openings 140o1, 140o2, 140o3 and 140o4 can be formed. Each of the openings 140o1, 140o2, 140o3 and 140o4 can penetrate the dielectric layer 140. The opening 140o4 can further penetrate the isolation feature 131. The openings 140o1, 140o2, 140o3 and 140o4 can be formed by an etching operation, such as wet etching, dry etching or other suitable processes.

Figure 6E:
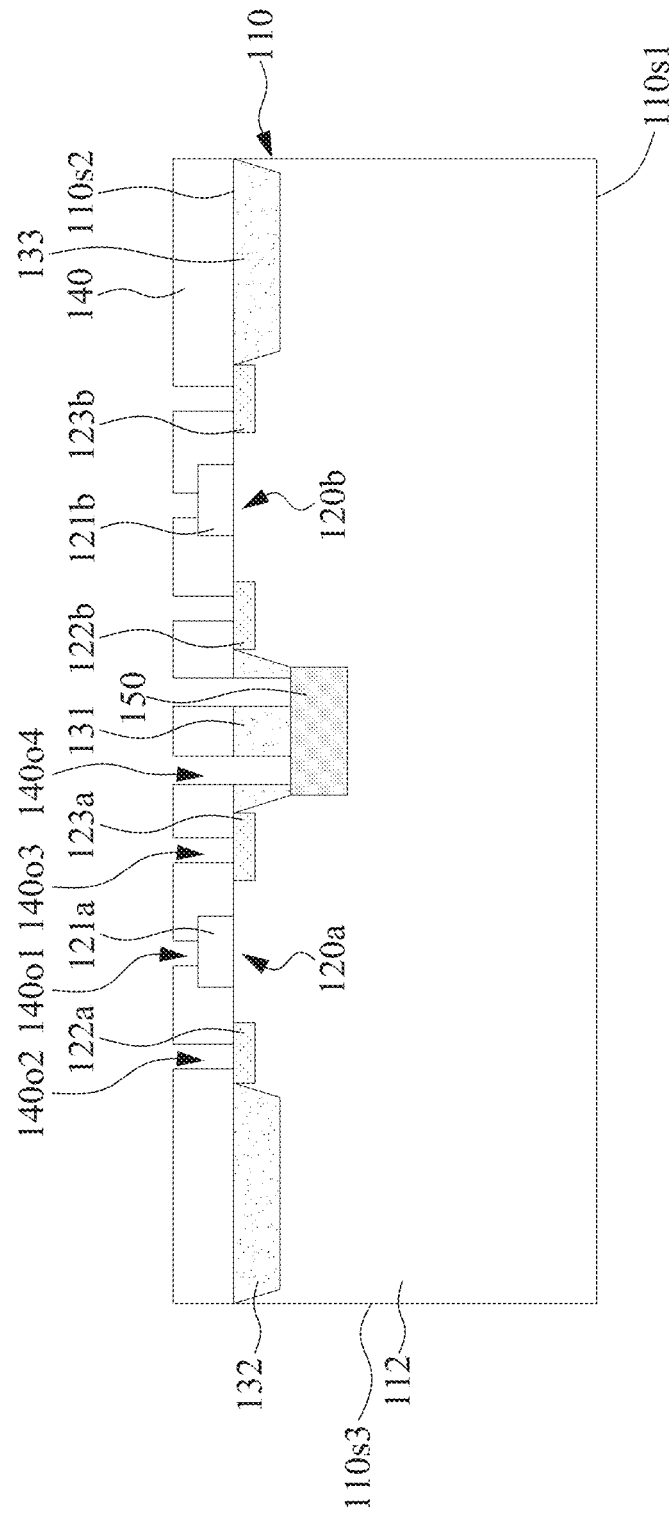

Referring to FIG. 6E, the doped regions 122a, 122b, 123a, 123b, and 150 can be formed within the substrate 110. Thus, the transistors 120a and 120b can be formed. In some embodiments, the doped regions 122a, 122b, 123a, 123b, and 150 can be formed by the same implant operation. In some embodiments, the doped regions 122a, 122b, 123a, 123b, and 150 can be formed by different implant operations.

Figure 6F:
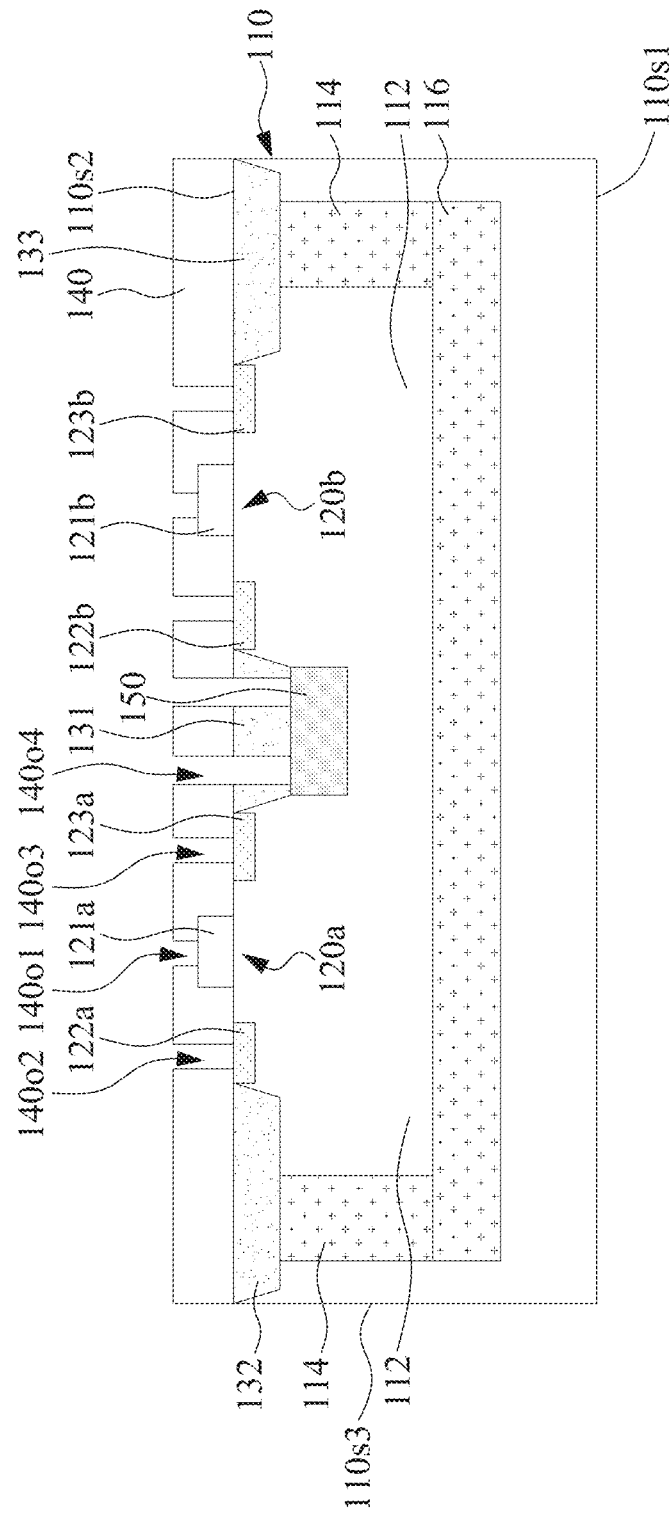

Referring to FIG. 6F, the well regions 114 and 116 can be formed within the substrate 110. In some embodiments, the well regions 114 and 116 can be formed by the same implant operation. In some embodiments, the well regions 114 and 116 can be formed by different implant operations.

Figure 6G:
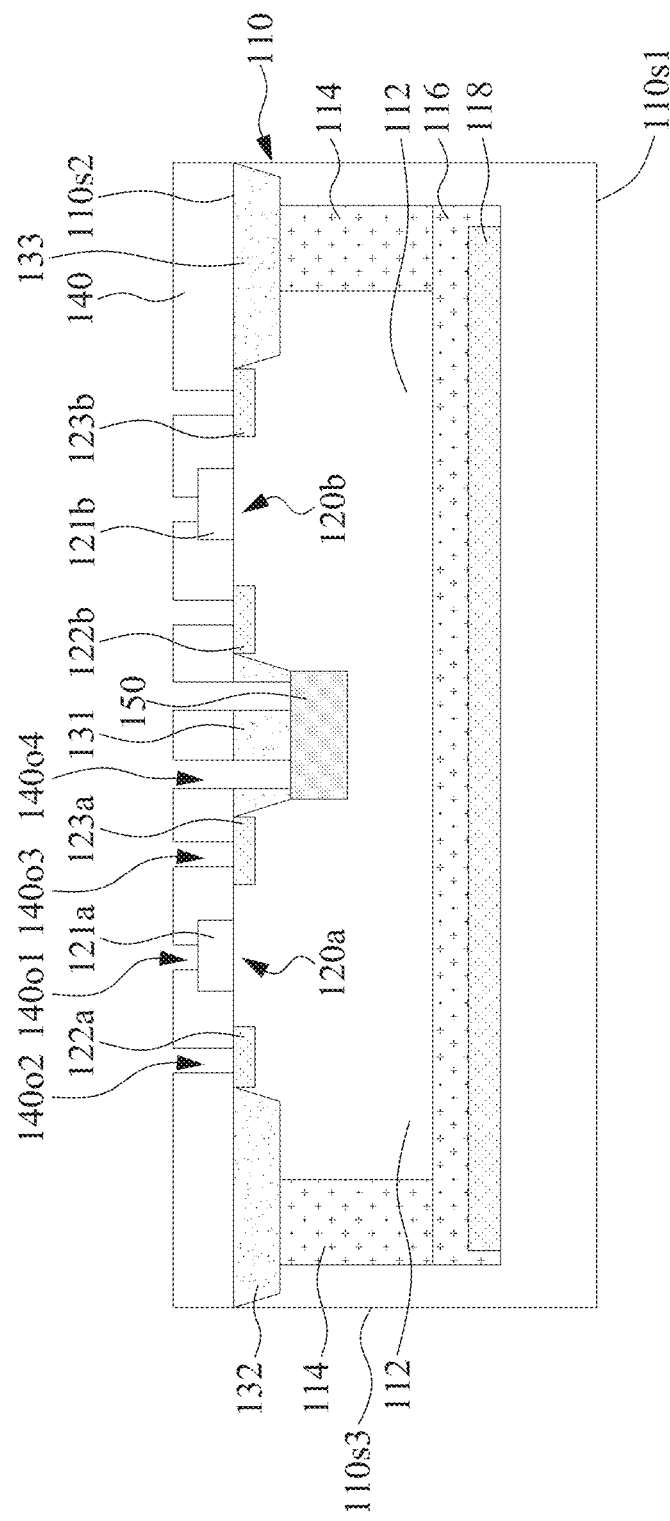

Referring to FIG. 6G, the doped region 118 can be formed within the well region 116. It should be noted that the order in which to form the well regions 112, 114, 116 and the doped region 118 can be modified.

Figure 6H:
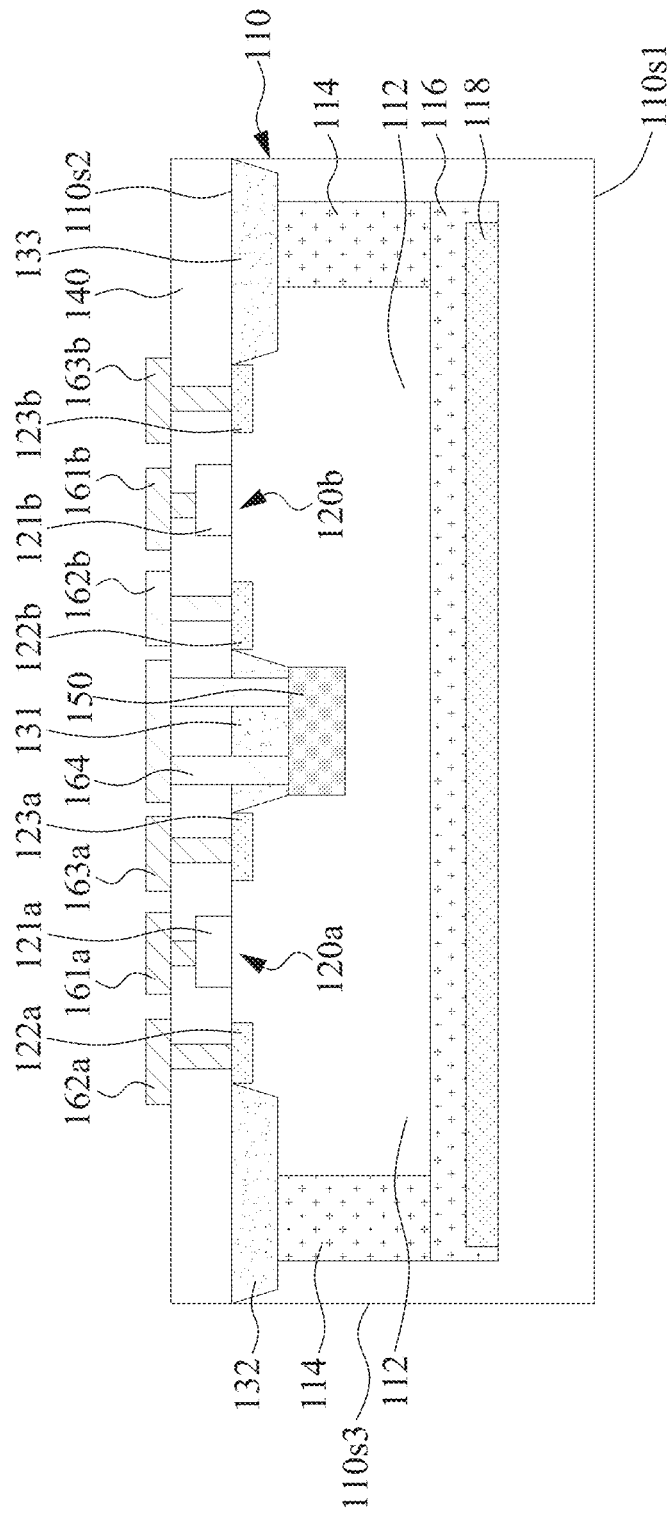

Referring to FIG. 6H, the conductive structures 161a, 162a, 163a, 161b, 162b, 163b, and 164 can be formed to fill the openings 140o1, 140o2, 140o3 and 140o4. The conductive structures 161a, 162a, 163a, 161b, 162b, 163b, and 164 can be formed by sputtering, chemical vapor deposition (CVD), physical vapor deposition (PVD), electrochemical plating (ECP), electrodeposition (ELD), atomic layer deposition (ALD), or the like, or combinations thereof.

Figure 6I:
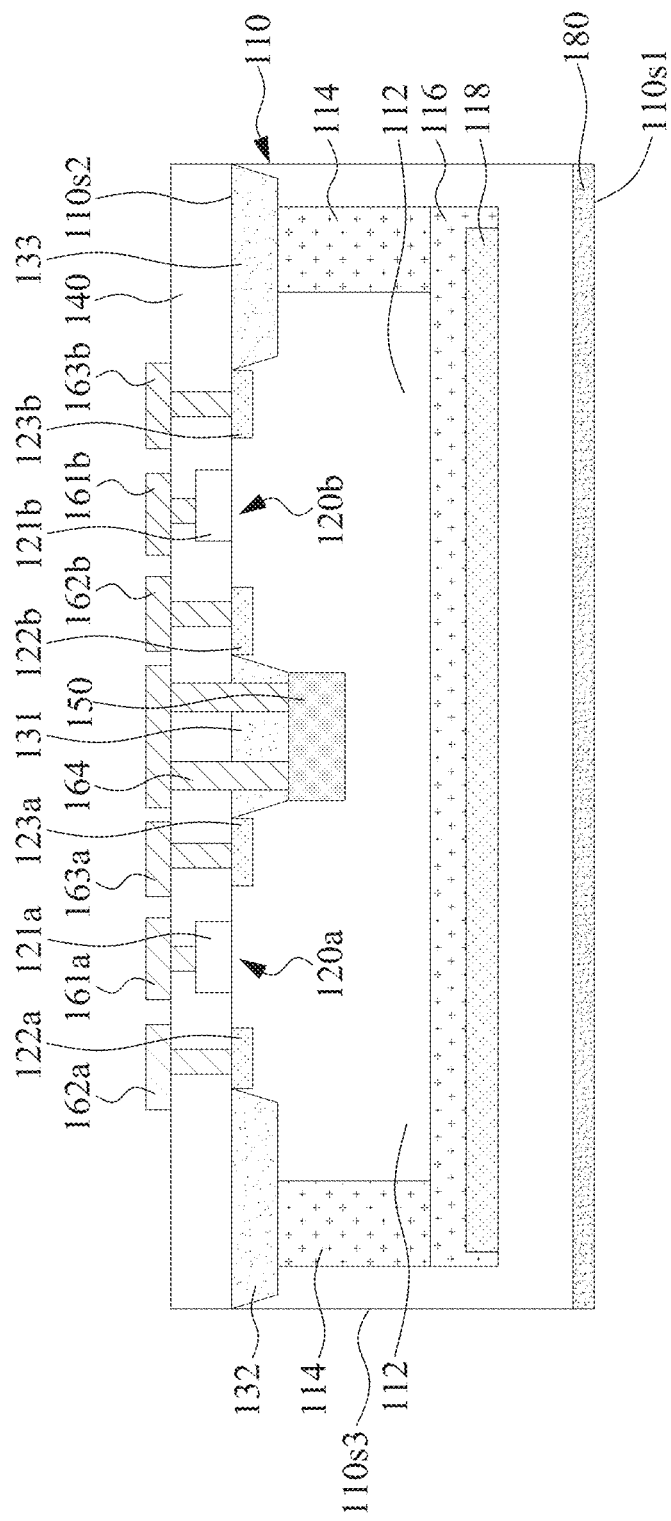

Referring to FIG. 6I, the dielectric layer 180 can be formed on the surface 110s1 of the substrate 110. In some embodiments, the dielectric layer 180 can be formed by oxidation of the substrate 110. In some embodiments, before forming the dielectric layer 180, a removal operation can be performed to remove the substrate 110 from the surface 110s1 of the substrate 110. In some embodiments, the removal operation can include, for example, a chemical mechanical polish operation.

Figure 6J:
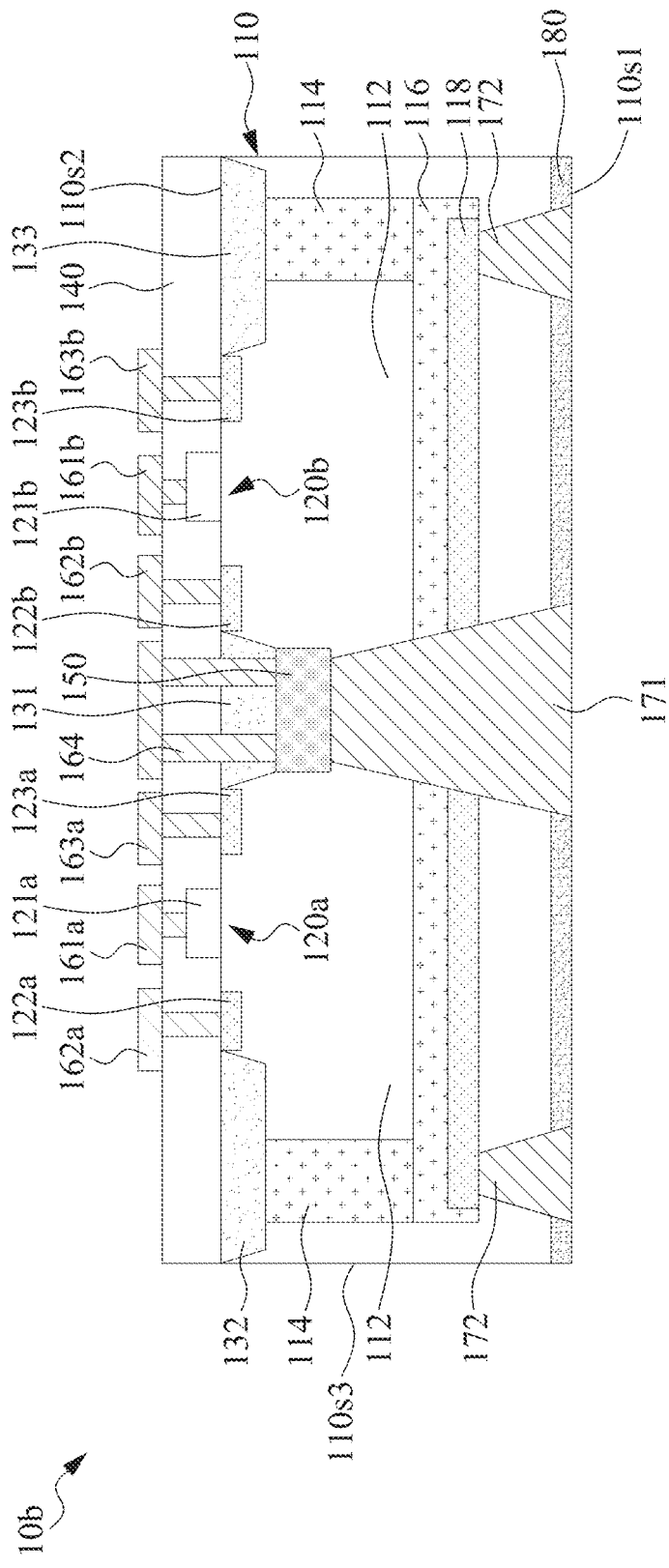

Referring to FIG. 6J, the conductive features 171 and 172 can be formed. As a result, the semiconductor device structure 10b can be produced. In some embodiments, a plurality of openings are formed to expose the doped regions 150 and 118. The openings can extend from the surface 110s1 of the substrate 110. Then, a liner layer (not shown), barrier layer (not shown), and conductive layer are formed to fill the openings to form the conductive features 171 and 172. In some embodiments, the liner layer, barrier layer and conductive layer can be formed by sputtering, CVD, PVD, ECP, ELD, ALD, or the like, or combinations thereof. The conductive feature 171 can be in contact with the doped region 150, and the conductive feature 172 can be in contact with the doped region 118.

Figure 7A:
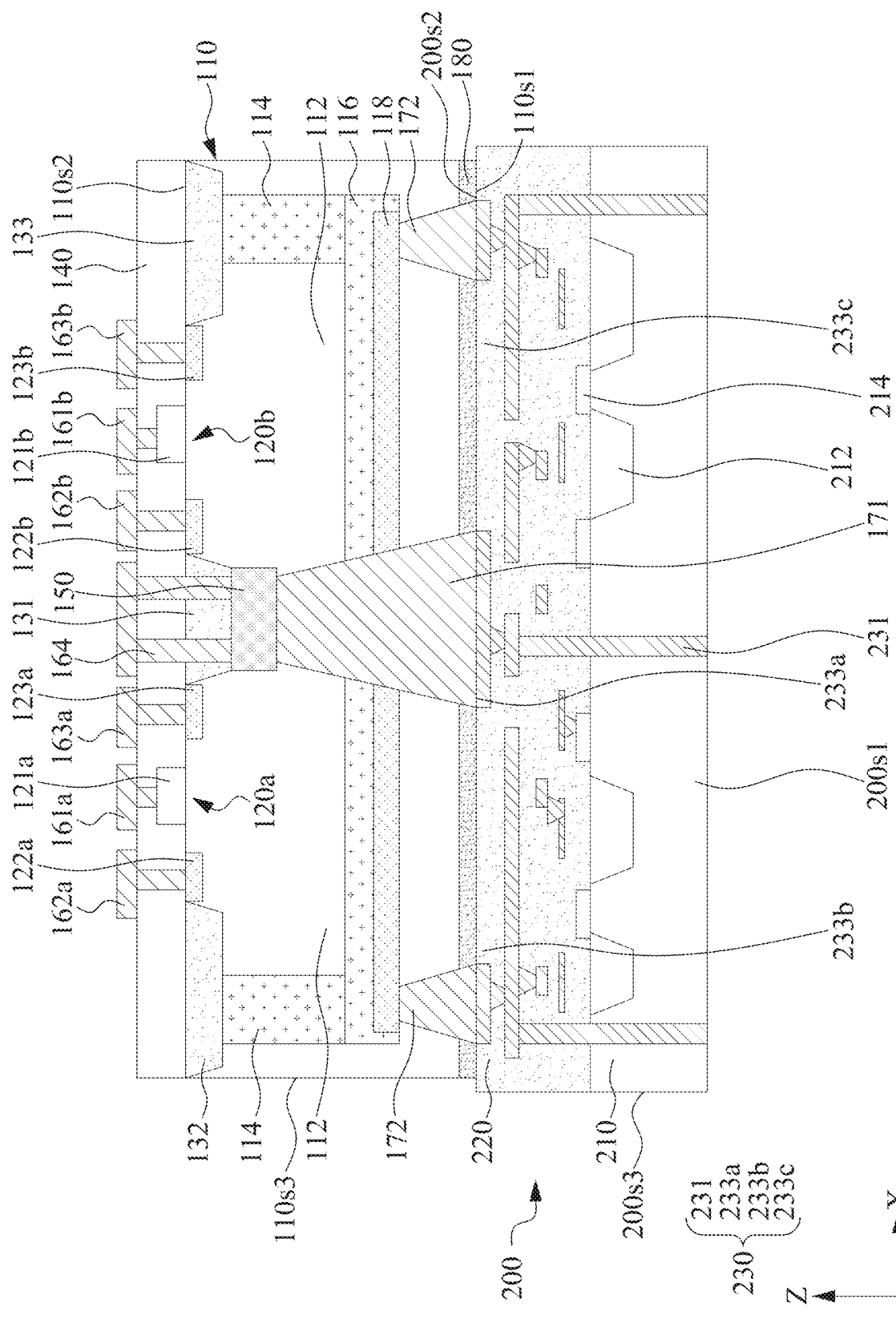
FIG. 7A and FIG. 7B illustrate various stages of manufacturing a semiconductor device structure, in accordance with some embodiments of the present disclosure.
Figure 7B:
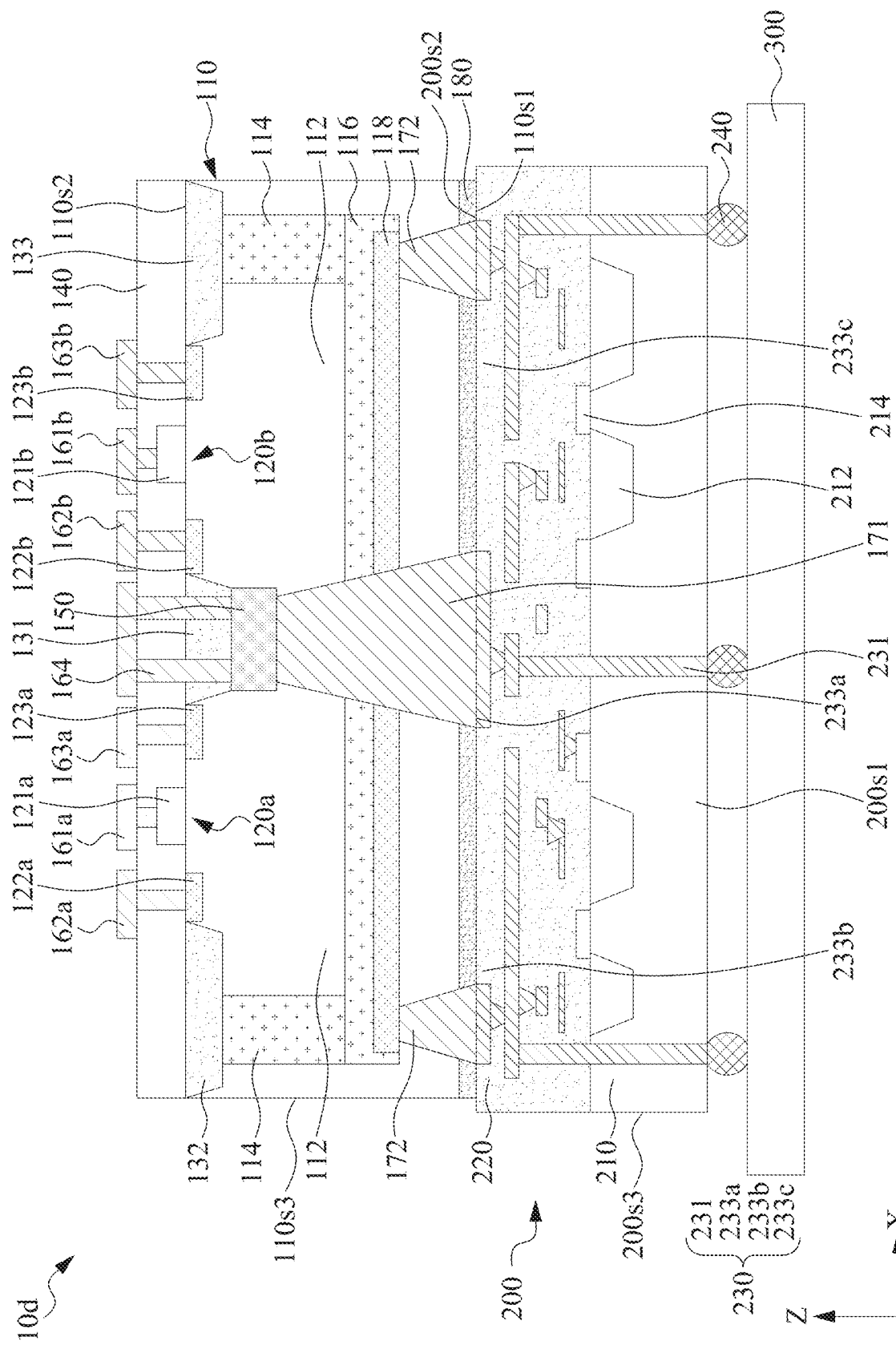

FIG. 7A and FIG. 7B illustrate various stages of manufacturing a semiconductor device structure 10d, in accordance with some embodiments of the present disclosure. In some embodiments, the initial stages before FIG. 7A of the illustrated process are the same as, or similar to, the stages illustrated in FIG. 6A through FIG. 6J. FIG. 7A depicts a stage subsequent to that depicted in FIG. 6J.

Referring to FIG. 7A, the circuit structure 200 can be provided and bonded to the surface 110s1 of the substrate 110. The surface 200s2 of the circuit structure 200 can be bonded to the surface 110s1 of the substrate 110. In some embodiments, the circuit structure 200 can be hybrid bonded to the substrate 110. For example, the substrate 110 is bonded to the circuit structure 200 through binding the dielectric structure 220 of the circuit structure 200 to the dielectric layer 180 of the substrate 110, and through the terminals 233a, 233b, and 233c of the circuit structure 200 to the conductive features 171 and 172 of the substrate 110.

Referring to FIG. 7B, the circuit board 300 can be provided and bonded to the surface 200s1 of the circuit structure 200 through the terminals 240. As a result, the semiconductor device structure 10d can be formed.

Figure 8:
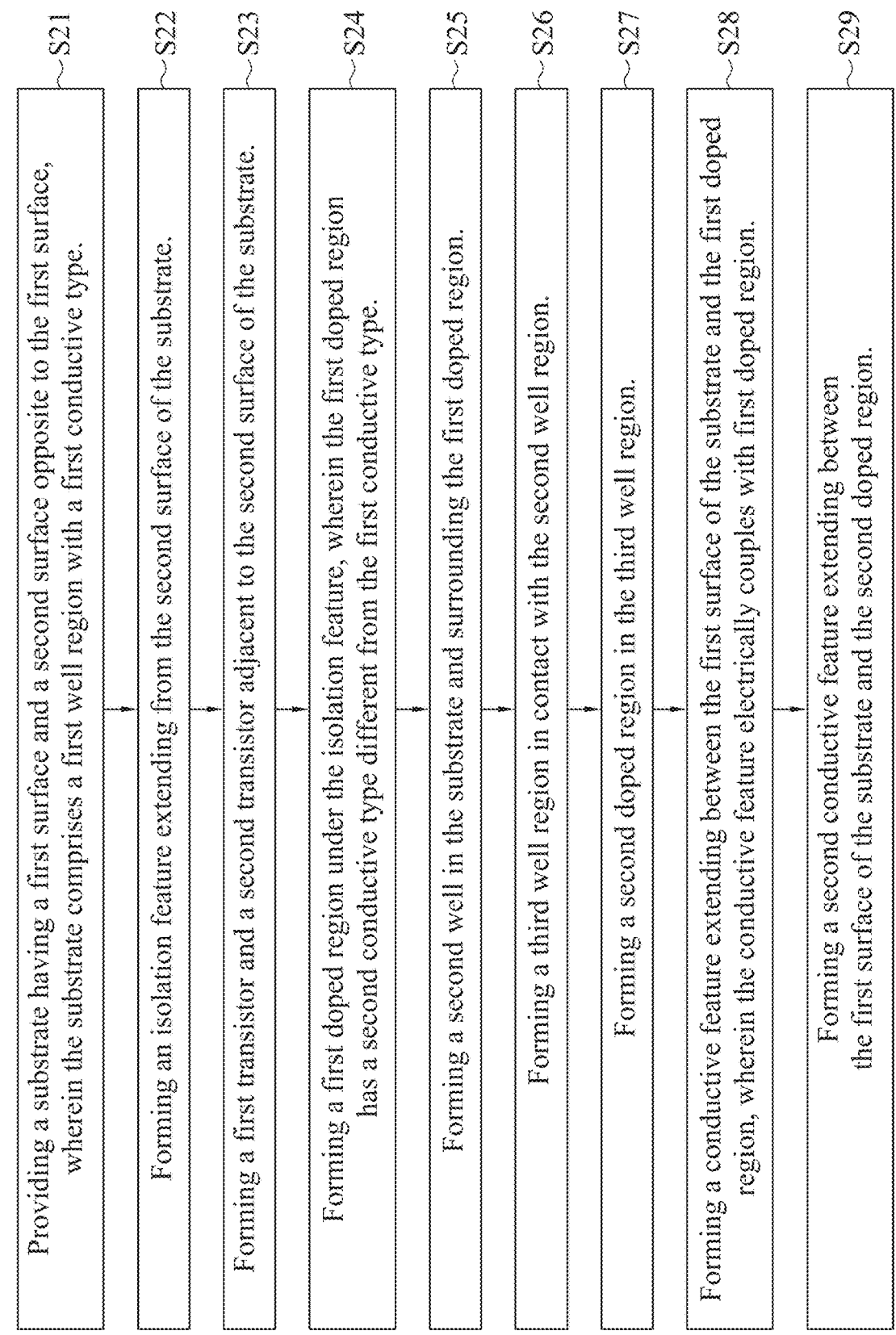
FIG. 8 is a flow chart illustrating a method for manufacturing a semiconductor device structure, in accordance with various aspects of the present disclosure.

FIG. 8 is a flow chart illustrating a method 20 for manufacturing a semiconductor device structure, in accordance with various aspects of the present disclosure.

The method 20 begins with operation S21 in which a substrate is provided. The substrate has a first surface and a second surface opposite to the first surface, wherein the substrate includes a first well region with a first conductive type.

The method 20 continues with operation S22 in which an isolation feature is formed. The isolation feature extends from the second surface of the substrate.

The method 20 continues with operation S23 in which a first transistor and a second transistor are formed adjacent to the second surface of the substrate.

The method 20 continues with operation S24 in which a first doped region is formed under the isolation feature. The first doped region has a second conductive type different from the first conductive type.

The method 20 continues with operation S25 in which a second well region is formed in the substrate and surrounding the first doped region.

The method 20 continues with operation S26 in which a third well region is formed. The third well region is spaced apart from the second surface of the substrate and in contact with the second well region.

The method 20 continues with operation S27 in which a second doped region is formed in the third well region.

The method 20 continues with operation S28 in which a first conductive feature is formed. The first conductive feature extends between the first surface of the substrate and the first doped region, wherein the first conductive feature electrically couples with first doped region.

The method 20 continues with operation S29 in which a second conductive feature is formed. The second conductive feature extends between the first surface of the substrate and the second doped region.

The method 20 is merely an example, and is not intended to limit the present disclosure beyond what is explicitly recited in the claims. Additional operations can be provided before, during, or after each operations of the method 20, and some operations described can be replaced, eliminated, or moved around for additional embodiments of the method. In some embodiments, the method 20 can include further operations not depicted in FIG. 8. In some embodiments, the method 20 can include one or more operations depicted in FIG. 8.

Figure 9:
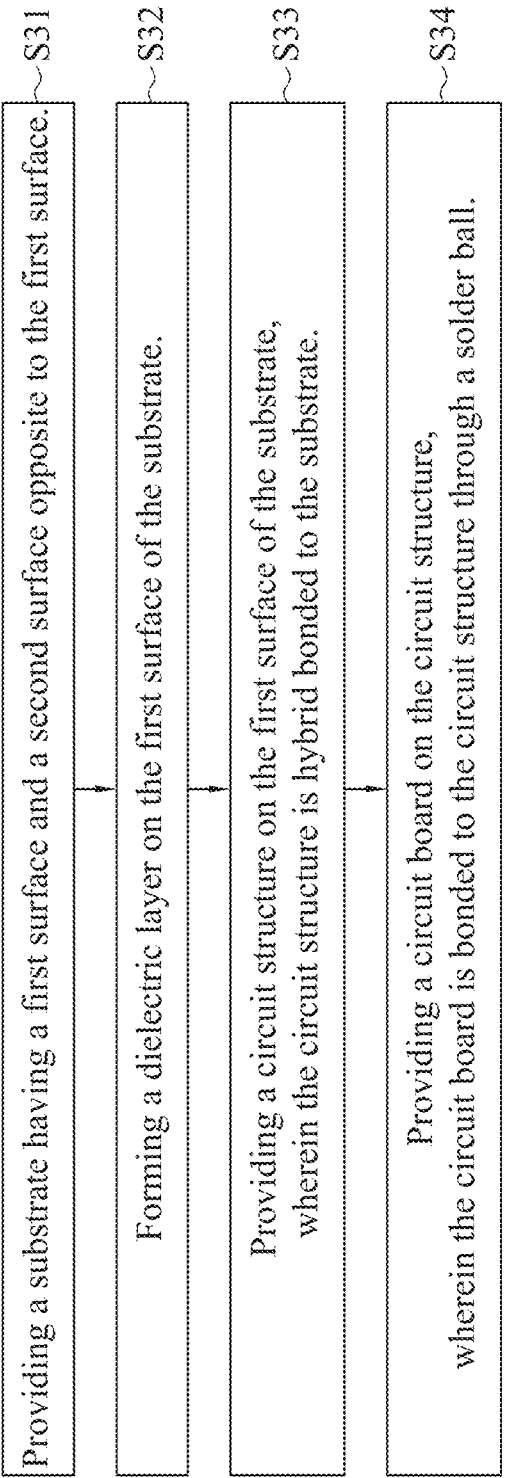
FIG. 9 is a flow chart illustrating a method for manufacturing a semiconductor device structure, in accordance with various aspects of the present disclosure.

FIG. 9 is a flow chart illustrating a method 30 for manufacturing a semiconductor device structure, in accordance with various aspects of the present disclosure.

The method 30 begins with operation S31 in which a substrate is provided. The substrate has a first surface and a second surface opposite to the first surface, wherein the substrate includes a first well region with a first conductive type. The substrate includes a first transistor and a second transistor adjacent to the second surface of the substrate. The substrate includes a first doped region, wherein the first doped region has a second conductive type different from the first conductive type. The substrate includes a conductive feature extending between the first surface of the substrate and the first doped region.

The method 30 continues with operation S32 in which a dielectric layer is formed on the first surface of the substrate.

The method 30 continues with operation S33 in which a circuit structure is provided on the first surface of the substrate. The circuit structure is hybrid bonded to the substrate.

The method 30 continues with operation S34 in which a circuit board is provided on the circuit structure. The circuit board is bonded to the circuit structure through a solder ball.

The method 30 is merely an example, and is not intended to limit the present disclosure beyond what is explicitly recited in the claims. Additional operations can be provided before, during, or after each operations of the method 30, and some operations described can be replaced, eliminated, or moved around for additional embodiments of the method. In some embodiments, the method 30 can include further operations not depicted in FIG. 9. In some embodiments, the method 30 can include one or more operations depicted in FIG. 9.

One aspect of the present disclosure provides a semiconductor device structure. The semiconductor device structure includes a first substrate, a first well region, a first gate structure, a second gate structure, a first doped region, and a first conductive feature. The substrate has a first surface and a second surface opposite to the first surface. The first well region is in the first substrate. The first well region has a first conductive type. The first gate structure is disposed on the second surface. The second gate structure is disposed on the second surface. The first doped region includes a second conductive type different from the first conductive type. The first doped region is disposed between the first gate structure and the second gate structure. The first conductive feature extends between the first surface of the first substrate and the first doped region.

Another aspect of the present disclosure provides a semiconductor device structure. The semiconductor device structure includes a substrate, a first well region, a first transistor, a second transistor, a first doped region, and a circuit structure. The substrate has an active surface and a backside surface. The first well region is in the substrate. The first well region has a first conductive type. The first transistor is adjacent to the active surface of the substrate. The second transistor is adjacent to the active surface of the substrate. The first doped region includes a second conductive type different from the first conductive type. The first doped region is disposed in the first well region and between the first transistor and the second transistor. The circuit structure is on the backside surface of the substrate. The circuit structure is configured to transmit or provide a voltage electrically coupled with the first doped region.

Another aspect of the present disclosure provides a method for manufacturing a semiconductor device structure. The method includes: providing a substrate having a first surface and a second surface opposite to the first surface, wherein the substrate comprises a first well region with a first conductive type; forming an isolation feature extending from the second surface of the substrate; forming a first transistor and a second transistor adjacent to the second surface of the substrate; forming a first doped region under the isolation feature, wherein the first doped region has a second conductive type different from the first conductive type; and providing a circuit structure on the first surface of the substrate, wherein the circuit structure is configured to transmit or provide a voltage electrically coupled with the first doped region.

Another aspect of the present disclosure provides a method for manufacturing a semiconductor device structure. The method includes: providing a substrate having a first surface and a second surface opposite to the first surface, wherein the substrate comprises a first well region with a first conductive type; forming a first transistor and a second transistor adjacent to the second surface of the substrate; forming a first doped region between the first transistor and the second transistor, wherein the first doped region has a second conductive type different from the first conductive type; and forming a first conductive feature extending between the first surface of the substrate and the first doped region.

The embodiments of the present disclosure disclose a semiconductor device structure with a doped region in a substrate. The aforesaid doped region has a conductive structure opposite to that of a well region of the substrate. The doped region is configured to generate a PN junction so as to electrically isolate adjacent transistors. Further, the semiconductor device structure includes a conductive structure extending from the backside surface of the substrate to electrically couple with the doped region. A power, such as a direct current bias, is provided from the backside surface to couple with the doped region through the conductive structure, generating a PN junction between the doped region and the well region of the substrate. In a comparative example, the conductive traces, being configured to couple with the doped region, are disposed on the active surface of the substrate. These conductive traces need additional areas and thus reduce the size of the active regions of the transistors. In comparison with the comparative example, the embodiments of the present disclosure can increase the size of the active regions of the transistors, and thus the performance of the semiconductor device structure is improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a first substrate having a first surface and a second surface opposite to the first surface;
   a first well region in the first substrate, wherein the first well region has a first conductive type;
   a first gate structure disposed on the second surface;
   a second gate structure disposed on the second surface;
   a first doped region with a second conductive type different from the first conductive type, wherein the first doped region is disposed between the first gate structure and the second gate structure;

a first conductive feature extending between the first surface of the first substrate and the first doped region;

a second well region in the first substrate and surrounding the first gate structure and the second gate structure; and a third well region in the first substrate and in contact with the second well region, wherein the third well region is in contact with the first conductive feature, and each of the second well region and the third well region has the second conductive type.

2. The semiconductor device structure of claim 1, further comprising:

an isolation feature adjacent to the second surface of the first substrate, wherein the first doped region is located between the isolation feature and the first conductive feature.

3. The semiconductor device structure of claim 2, further comprising:

a conductive structure penetrating the isolation feature and in contact with the first doped region.

4. The semiconductor device structure of claim 3, wherein the first conductive feature is electrically coupled to the conductive structure.

5. The semiconductor device structure of claim 1, further comprising:

a second doped region in the third well region, wherein the second doped region has the second conductive type.

6. The semiconductor device structure of claim 5, further comprising:

a second conductive feature extending between the first surface of the first substrate and the second doped region.

7. The semiconductor device structure of claim 6, wherein a first length of the first conductive feature in a first direction is greater than a second length of the second conductive feature in the first direction.

8. The semiconductor device structure of claim 6, wherein the second doped region is in contact with the first conductive feature.

9. The semiconductor device structure of claim 6, wherein the second doped region is spaced apart from the first conductive feature.

10. The semiconductor device structure of claim 1, further comprising:

a circuit structure disposed on the first surface of the first substrate, wherein the circuit structure is electrically connected to the first conductive feature.

11. The semiconductor device structure of claim 10, further comprising:

a circuit board bonded to the circuit structure, wherein the circuit structure is disposed between the circuit board and the first substrate.

12. The semiconductor device structure of claim 10, further comprising:

a first dielectric layer on the first surface of the first substrate, wherein the circuit structure comprises a terminal in contact with the first conductive feature and a dielectric structure in contact with the first dielectric layer.

* * * * *